United States Patent
Grohs et al.

[11] Patent Number: 6,130,630
[45] Date of Patent: Oct. 10, 2000

[54] APPARATUS AND METHOD FOR COMPRESSING HUFFMAN ENCODED DATA

[75] Inventors: Randall E. Grohs, Eagle; Brent M. Bradburn, Boise, both of Id.

[73] Assignee: Hewlett-Packard Company, Palo Alto, Calif.

[21] Appl. No.: 09/179,925

[22] Filed: Oct. 27, 1998

[51] Int. Cl.[7] .............................. H03M 7/38; H03M 7/34
[52] U.S. Cl. ................................................. 341/51; 341/65
[58] Field of Search .................. 341/50, 51, 67, 341/665; 395/115, 112

[56] References Cited

U.S. PATENT DOCUMENTS

| | | | |
|---|---|---|---|
| 4,586,027 | 4/1986 | Tsukiyama et al. | 340/347 |
| 4,988,998 | 1/1991 | O'Brien | 341/55 |
| 5,357,546 | 10/1994 | Meriwether et al. | 375/122 |
| 5,394,143 | 2/1995 | Murray et al. | 341/63 |
| 5,490,237 | 2/1996 | Zimmerman et al. | 395/115 |
| 5,701,125 | 12/1997 | Berlin | 341/63 |
| 5,706,410 | 1/1998 | Bagley et al. | 395/112 |

*Primary Examiner*—Peguy JeanPierre
*Attorney, Agent, or Firm*—Matthew L. Wade

[57] ABSTRACT

Apparatus and method for compressing Huffman encoded data. The compression apparatus includes a string detector and a record generator. The compression apparatus operates to receive the Huffman encoded data and the length of the codewords used to generate the Huffman encoded data. The string detector then operates to detect each set of repeating strings and each non-repeating string in the encoded data. Each set of repeating strings is replaced with a record that indicates the length of the repeating string, the number of repeats and an instantiation of the repeating string. In addition, each non-repeating string is replaced with a record that indicates the length of the non-repeating string and the non-repeating string. The resulting compressed Huffman data can then be transmitted to a printer.

10 Claims, 4 Drawing Sheets

APPARATUS AND METHOD FOR COMPRESSING HUFFMAN ENCODED DATA

CROSS REFERENCE TO RELATED APPLICATIONS

This application includes subject matter related to co-pending application entitled: "System For Compression Of Digital Images Comprising Low Detail Areas" having Ser. No. 09181066, and the co-pending patent application entitled: "System For Compression Of Digital Images Comprising Background Pixels" having Ser. No. 09181031 each of which are incorporated by reference herein, assigned to the same assignee as this application, and filed on even date herewith.

FIELD OF THE INVENTION

This invention relates to the compression of digital images, and more particularly to the compression and decompression of Huffman encoded data.

BACKGROUND OF THE INVENTION

A digital image is typically displayed or printed in the form of a rectangular array of "picture elements" or "print elements". For purposes of this application, both "picture elements" and "print elements" are referred to herein as "pixels". Digital images are typically represented in a computer by one or more arrays of binary numbers. For example, a monochrome digital image can be represented in a computer by a single array of binary numbers. Each binary number in the array defines a gray-level value for an associated pixel. The position of the binary number in the array describes the spatial location of the pixel.

A color digital image can be represented in a computer by three arrays of binary numbers. Each array (alternatively referred to herein as an "image plane") representing an axis of a suitable color coordinate system in accordance with the well known trichromatic theory. The color of a pixel in the digital image is defined by an associated binary number (defining one of three color components from the color coordinate system) from each array. It is noted that there are many color coordinate systems that can be used to represent the color of a pixel. These color coordinate systems include a "Red-Green-Blue" (RGB) coordinate system, a cyan-magenta-yellow (CMY) coordinate system and a luminescence (Y), red-yellow (Cr) and blue-yellow (Cb) color coordinate system. The former is commonly used in monitor display applications, the latter is commonly used in printing applications.

The amount of data used to represent a digital image can be extremely large. Consider, for example, a color digital image consisting of 1024×1024 pixels. If the pixels are represented in the computer by three image planes of 8-bit numbers, the digital image would occupy over 1 megabyte of storage space.

The large amount of data required to represent a digital image in a computer can result in significant costs that are associated both with increased storage capacity requirements, and the computing resources and time required to transmit the data to another computing device. In order to reduce these costs, digital image compression techniques have been and are continuing to be developed.

Digital image compression techniques can generally be divided into two classes: lossless and lossy. In lossless compression, the digital image reconstructed after compression is identical, pixel by pixel, to the original image. In lossy compression, the reconstructed digital image is degraded with respect to the original digital image in order to attain higher compression ratios than those of lossless procedures. One popular lossy compression scheme is referred to as "transform coding". See Baxes, G. A., *Digital image Processing, Principles and Applications*, pp 198–211, ISBN 0-471-00949-0 (1994). Those pages are incorporated herein by reference. A widely used transform coding scheme has been standardized by the published and generally available works of the Joint Photographic Experts Group (JPEG).

An encoding system that includes a transform encoder to encode a digital image will typically also have an entropy encoder to further compress the data generated by the transform encoder. See Pennebaker, W. B., and Mitchell, J. L., *JPEG: Still Image Compression Standard*, pp 65–79 and pp189–201, ISBN 0-442-01272-1 (1993). Those pages are incorporated herein by reference.

One popular entropy coding technique is referred to as Huffman coding. A Huffman encoder will typically utilize a Huffman statistical model to convert the output of a transform encoder into a series of symbols that represents an intermediate representation of the digital image. The Huffman encoder then operates to assign short code words to the symbols that occur most often and longer code words to the less probable symbols. The code words that are used in Huffman encoding are typically obtained from one or more tables, known as Huffman Tables. The resulting data represents the digital image in compressed form and is referred to herein as "Huffman encoded data".

Although Huffman coding is generally considered the best fixed length coding procedure available, the fact that the Huffman codes are an integral number of bits long can result in non-optimal coding. This can become a problem in the case when the probability of a particular character is high. See Nelson, M. and Gaily J., *The Data Compression Book*, pp113–114, ISBN 1-55851-434-1 (1995). Those pages are incorporated herein by reference.

SUMMARY OF THE INVENTION

In one embodiment of the present invention, a Compression Apparatus is provided to convert received Huffman encoded data into a compressed form. The compressing apparatus comprises a string detector and a record generator. The Compression Apparatus is adapted to receive Huffman encoded data and the length of the codewords used to generate the Huffman encoded data. Upon the compression apparatus receiving this information, the string detector responds by detecting any sets of repeating strings in the Huffman encoded data and to also detect each non-repeating string in the Huffman encoded data. For each set of repeating strings detected, the record generator responds thereto by replacing the set with a first record. The first record comprising data that can be used to reproduce the set of repeating strings. In addition, for each non-repeating string the record generator responds by replacing the non-repeating string with a second record. The second record comprising data that can be used to reproduce the non-repeating string.

In another embodiment, a method is provided for converting Huffman encoded data into a compressed form. The method comprising the steps of receiving Huffman encoded data and detecting each set of repeating strings and each non-repeating string in the Huffman encoded data. For each set of repeating strings, the set is replaced with an associated first record. In addition, each non-repeating string is replaced with an associated second record. The first record having information that can be used to later reproduce the set of repeating strings and the second record having information that can later be used to generate the non-repeating string.

DETAILED DESCRIPTION OF THE INVENTION

Figure 1:
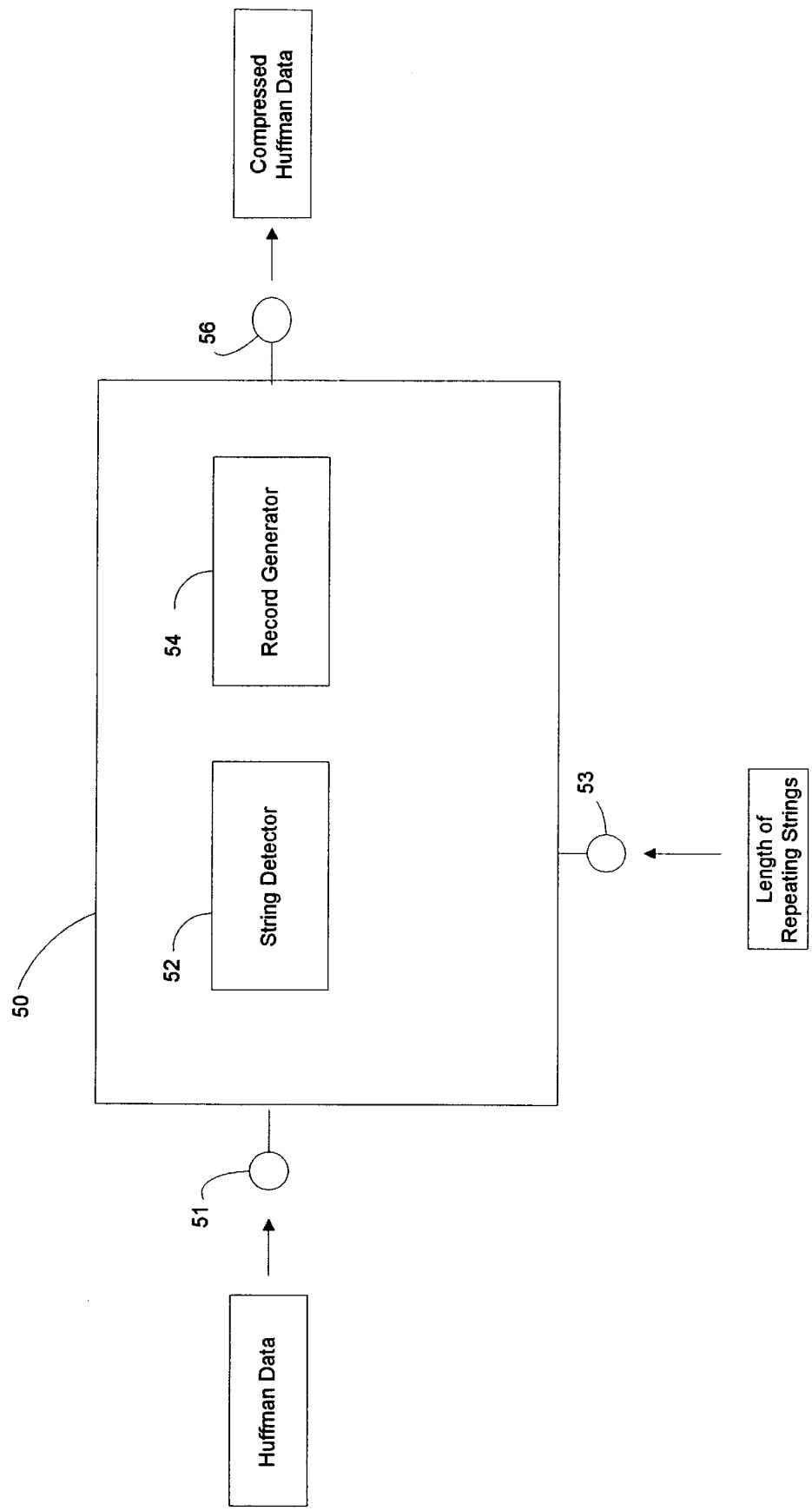
FIG. 1 is a high level diagram of Compression Apparatus that is adapted to convert Huffman encoded data into a compressed form.

In general, the present invention provides a data compression technique that can used to compress Huffman encoded data. As a first illustration of the present invention, FIG. 1 depicts a first embodiment in the form of Compression Apparatus 50. As will be clear to a person skilled in the art, Compression Apparatus 50 can be incorporated into a number of computing devices in order to compress Huffman encoded data. These computing devices include, but are not limited to, personal computers, scanners, printers and facsimile devices.

In general, Compression Apparatus 50 operates to convert a received Huffman encoded data stream into a second data stream that is representative of the Huffman encoded data in a compressed form. This compressed form is referred to as herein as "compressed Huffman data".

As shown, Compression Apparatus 50 includes String Detector 52 and Record Generator 54. Compression Apparatus 50 has two inputs: First Input 51 and Second Input 53. During the operation of Compression Apparatus 50, the Huffman Encoded data is presented to First Input 51. In addition, the length of the code words used to create the Huffman encoded data is presented to Second Input 53. In this embodiment, the length of the code words are obtained from the Huffman Tables used to originally create the Huffman Encoded data.

Upon receiving the Huffman encoded data and the length of the codewords used to generate the Huffman encoded data, String Detector 52 makes use of the known codeword lengths to identify repeating strings and non-repeating strings in the Huffman Encoded data stream. For each series of repeating strings detected, String detector 52 utilizes Record Generator 54 to generate a single record indicating the length of the repeating string, the number of repeats and a single instance of the repeating string. In addition, for each non-repeating string detected, String Detector 52 utilizes Record Generator 54 to generate an associated record indicating the length of the non-repeating string and an instance of the non-repeating string. As the records are generated, they are each transmitted in proper sequence in the form of a compressed Huffman data stream via Output 56. It is noted that this data stream can be transmitted to a memory device for storage or to another computing device for decompression. As can be seen by a person skilled in the art, the function of Compression Apparatus 50 could easily be implemented by way of a state machine or by a microprocessor and software routine.

Figure 2:
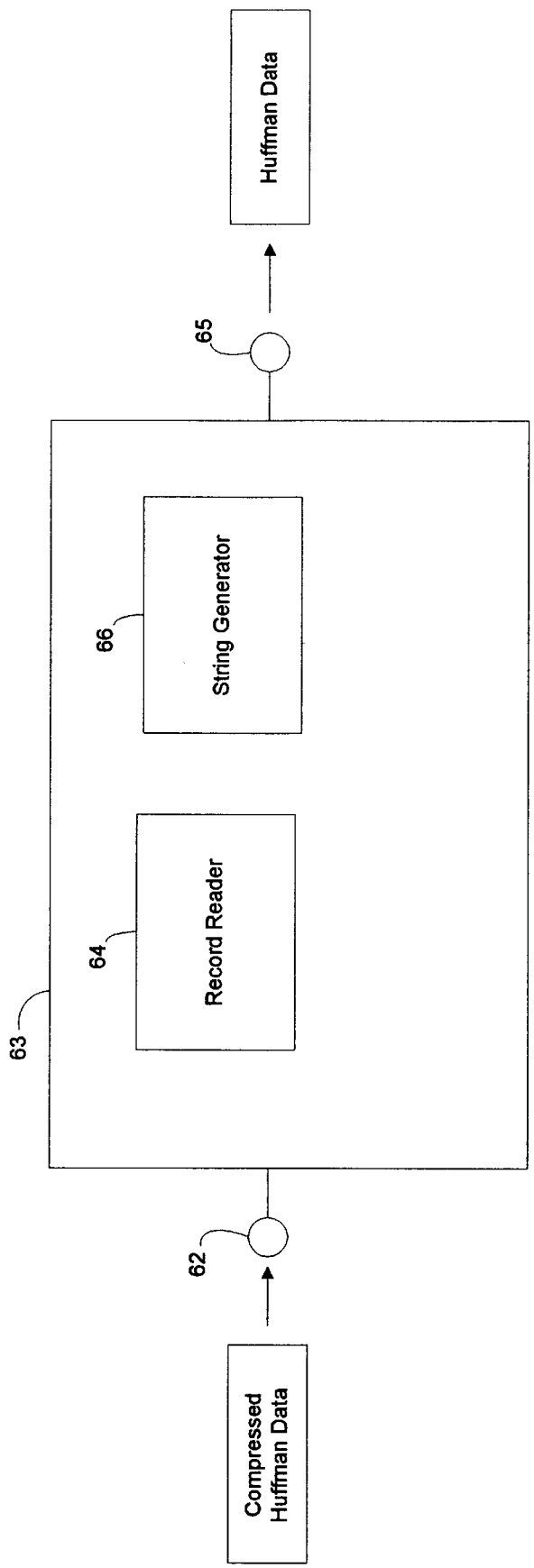
FIG. 2 is a high level diagram of Decompression Apparatus that is adapted to decompress compressed Huffman Data.

FIG. 2 illustrates a second embodiment of the present invention in the form of Decompression Apparatus 63 which can be used to convert compressed Huffman data back into Huffman encoded data. As illustrated, Decompression Apparatus 63 includes Record Reader 64, String Generator 66, Input 62 and Output 65. Upon presenting compressed Huffman data to Input 62, Record Reader 64 responds by reading and interpreting each record in the compressed Huffman data. For each record read, record Reader 64 utilizes String Generator 66 to generate the one or more strings indicated by the record in order to generate the Huffman encoded data. Decompression Apparatus 63 can then transmit the Huffman encoded data via Output 65.

One important use of the present invention is to further reduce the data representative of a digital image prior to transmitting the digital image to a printer for printing. Many printers are configured to receive data from a host computer in a control language format. A widely used control language is called "printer control language" (PCL). When operating in a PCL environment, a host computer configures a data stream to include both print function commands and interspersed print data. The printer converts the received data stream into a list of simple commands, called display commands, which define what must be printed. The printer then processes the display commands and renders the described objects into a digital image suitable for printing. This type of digital image is commonly referred to as a raster bit map or alternatively as rasterized data. In general, only a small proportion of the printer's available memory is allocated to store the print function commands and interspersed data, with the majority of the print buffer area being given over to support of processing functions and the resultant raster bit map image. Other printer systems employ a procedure wherein the host computer rasterizes image data and sends it to the printer in the rasterized form. This enables the use of a host computer's processor, which typically has greater capability than the printer processor, to accomplish the rasterization of the image. The host computer, after the rasterization has been performed, then transfers the rasterized data to the printer. Sometimes the rasterized data is first compressed before transmitting the data to the printer in order to reduce the time and computing resources required to transmit the rasterized data. This also serves to reduce the amount of printer memory required to receive the digital image. In this case, the printer includes decompression capability that is used to decompress the rasterized data. After decompression, the rasterized data can then be transmitted to the printer's video buffer for printing. For examples of such systems see, U.S. Pat. No. 5,490,237 entitled: "Page Printer Having Improved System For Receiving And Printing Raster Pixel Image Data From A Host Computer". Also see U.S. Pat. No. 5,706,410 entitled: "Printing System Having Control Language Command And Raster Pixel Image Data Processing Capability". Both of these patents are incorporated herein by reference.

In the co-pending applications entitled: "System For Compression Of Digital Images Comprising Low Detail Areas," having Ser. No. 09/181,066, and the co-pending patent application entitled: "System For Compression Of Digital Images Comprising Background Pixels", having attorney's docket number 10981977-1, techniques are described that can be used to compress a digital image in a computer prior to its transmission to a printer for printing. In certain embodiments of these inventions, Huffman Encoded data is generated prior to transmitting the compressed image data to the printer. It can be seen that the present invention can be used to provide further compression of the image data in these situations. According to the principles of the present invention, the Huffman Encoded Data generated by the computer can be converted to compressed Huffman data prior to its transmission to the printer.

Figure 3:
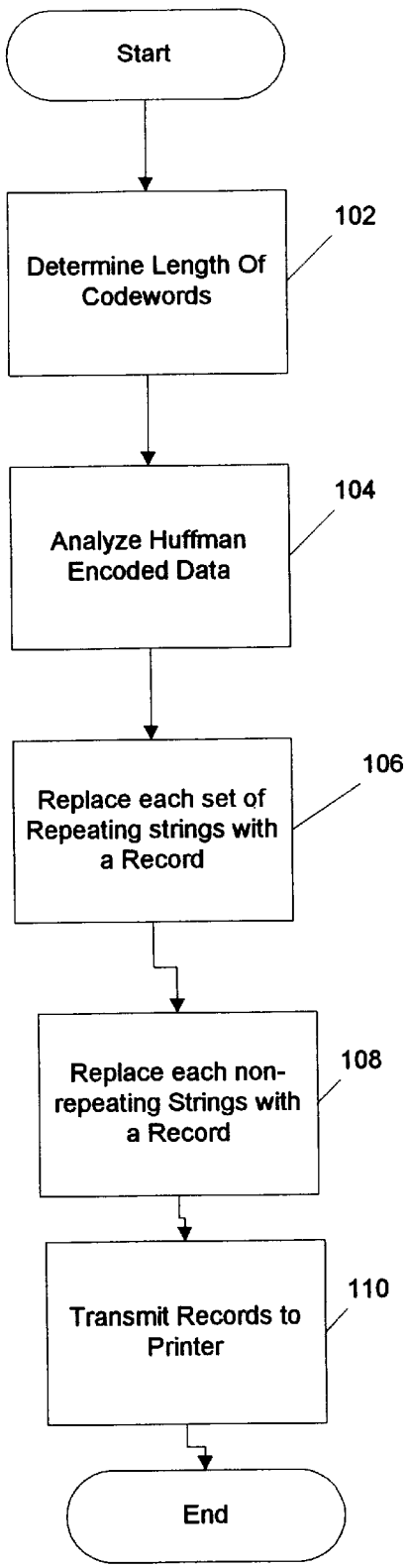
FIG. 3 is a high level flow diagram for compressing Huffman encoded data.
Figure 4:
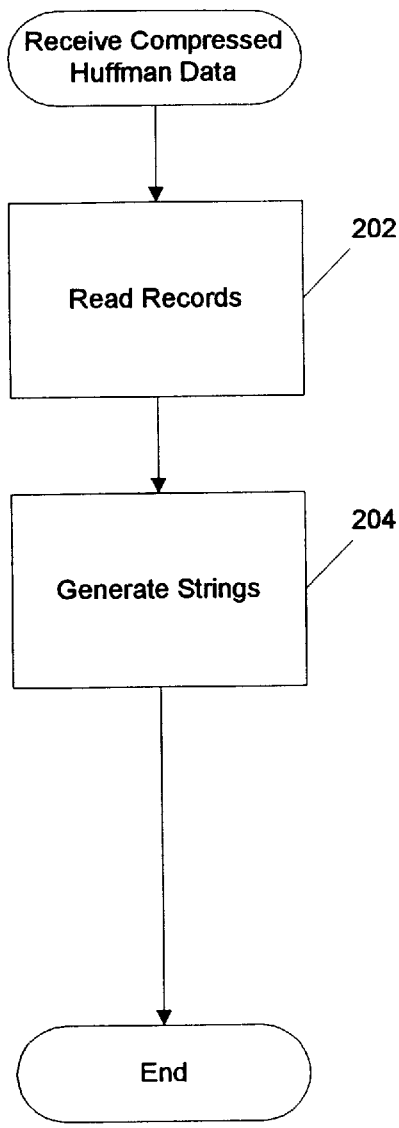
FIG. 4 is high level flow diagram for decompressing Huffman encoded data.

To illustrate this aspect of the present invention, FIG. 3 depicts yet another embodiment of the present invention. In this embodiment, it is assumed that the Huffman encoded data was generated in accordance with both the JPEG lossy mode compression standard and the principles taught in the co-pending application entitled: "System For Compression Of Digital Images Comprising Background Pixels".

Referring now to FIG. 3, after Huffman encoded data is generated, the length of the Huffman codewords are determined from the Huffman Tables used to generate the Huffman encoded data (box 102). Using the known length of these codewords, the Huffman encoded data is then analyzed to identify any repeating strings and the non-repeating strings in the data (box 104). Each set of repeating strings is then replaced with a record that indicates the length of the repeating string, the number of repeats and an instance of the repeating string (106). In addition, each non-repeating string is replaced with a record that indicates the length of the non-repeating string and the non-repeating string (box 108). These records, which form the compressed Huffman data, can then be transmitted to the printer (box 110).

To illustrate the usefulness of the present invention to reduce the amount of data required to represent a digital image, Table 1 provides an excerpt of Huffman encoded data. The Huffman encoded data was generated by compressing a uniformly colored digital image in accordance with the JPEG lossy mode compression standard. It can be seen that this is one situation where Huffman encoding is non-optimal. This is because, as previously indicated, Huffman codes are an integral number of bits long and the probability of a single character is high. As shown in Table 1, the Huffman encoded data consists of a short repeating string: "28 A0 02 8A 00". In accordance with the principles of the present invention, compressed Huffman data can be generated for this Huffman encoded data that consists of a single record for all the repeating strings shown in Table 1. As understood by a person skilled in the art, this can significantly reduce the amount of data required to represent the original digital image.

without departing from the invention. Accordingly, the present invention is intended to embrace all such alternatives, modifications and variances that fall within the scope of the appended claims.

What is claimed is:

1. Apparatus for converting Huffman encoded data into a plurality of records comprising (a) means for detecting a series of identical Huffman code words in the Huffman encoded data; and (b) means for replacing the series with a single record, the record including only one of the identical Huffman code words and an indicator indicating the number of Huffman code words present in the series.

2. The apparatus as recited in claim 1, wherein the Huffman encoded data describes a digital image.

3. The apparatus as recited in claim 2, wherein the series is associated with a uniformly colored area in said digital image.

4. The apparatus as recited in claim 3, wherein said uniformly colored area is white.

5. The apparatus as recited in claim 4, further comprising means for transmitting said record to a printer.

6. A method for converting Huffman encoded data, including a series of identical Huffman code words, into a plurality of records, comprising:

(a) analyzing the Huffman encoded data to identify the series; and (b) replacing the series with a first record, the first record including only a single one of the identical Huffman code words and an indicator indicating the number of Huffman code words present in the series.

7. The method of claim 6, wherein the first record further includes a second indicator indicating the length of the identical Huffman Code word.

8. The method of claim 7, further comprising:

(c) analyzing said Huffman encoded data to identify a non-repeating Huffman code word, and (d) replacing the non-repeating Huffman code word with a second record, the second record including only a single one of the non-repeating Huffman code word and a third indicator indicating the length of the non-repeating Huffman code word.

9. The method of claim 8, wherein the Huffman encoded data describes a digital image.

10. The method of claim 9, further comprising:

TABLE 1

| | |
|---|---|
| 000002F0 : 28 A0 02 8A 00 28 A0 02 8A 00 28 A0 02 8A 00 28 | (....(....(....( |
| 00000300 : A0 02 8A 00 28 A0 02 8A 00 28 A0 02 8A 00 28 A0 | ....(....(....(. |
| 00000310 : 02 8A 00 28 A0 02 8A 00 28 A0 02 8A 00 28 A0 02 | ...(....(....(.. |
| 00000320 : 8A 00 28 A0 02 8A 00 28 A0 02 8A 00 28 A0 02 8A | ..(....(....(... |
| 00000330 : 00 28 A0 02 8A 00 28 A0 02 8A 00 28 A0 02 8A 00 | .(....(....(.... |
| 00000340 : 28 A0 02 8A 00 28 A0 02 8A 00 28 A0 02 8A 00 28 | (....(....(....( |
| 00000350 : A0 02 8A 00 28 A0 02 8A 00 28 A0 02 8A 00 28 A0 | ....(....(....(. |
| 00000360 : 02 8A 00 28 A0 02 8A 00 28 A0 02 8A 00 28 A0 02 | ...(....(....(.. |
| 00000370 : 8A 00 28 A0 02 8A 00 28 A0 02 8A 00 28 A0 02 8A | ..(....(....(... |
| 00000380 : 00 28 A0 02 8A 00 28 A0 02 8A 00 28 A0 02 8A 00 | .(....(....(.... |
| 00000390 : 28 A0 02 8A 00 28 A0 02 8A 00 28 A0 02 8A 00 28 | (....(....(....( |
| 000003A0 : A0 02 8A 00 28 A0 02 8A 00 28 A0 02 8A 00 28 A0 | ....(....(....(. |
| 00000380 : 02 8A 00 28 A0 02 8A 00 28 A0 02 8A 00 28 A0 02 | ...(....(....(.. |
| 000603C0 : 8A 00 28 A0 02 8A 00 28 A0 02 8A 00 28 A0 02 8A | ..(....(....(... |

It should be understood that the foregoing description is only illustrative of the invention. Various alternatives and modifications can be devised by those skilled in the art (e) transmitting the first and second record to a printer.

* * * * *